United States Patent
Assefa et al.

(10) Patent No.: US 7,782,660 B2
(45) Date of Patent: Aug. 24, 2010

(54) MAGNETICALLY DE-COUPLING MAGNETIC MEMORY CELLS AND BIT/WORD LINES FOR REDUCING BIT SELECTION ERRORS

(75) Inventors: Solomon Assefa, Ossining, NY (US); Sivananda K. Kanakasabapathy, Niskayuna, NY (US); Janusz Jozef Nowak, Highland Mills, NY (US); Philip L Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 12/052,326

(22) Filed: Mar. 20, 2008

(65) Prior Publication Data
US 2009/0237982 A1   Sep. 24, 2009

(51) Int. Cl.
G11C 11/00 (2006.01)
(52) U.S. Cl. .................... 365/158; 365/171; 365/173
(58) Field of Classification Search ......... 257/294–295; 438/3; 365/158, 171, 173, 55, 74, 97
See application file for complete search history.

(56) References Cited

U.S. PATENT DOCUMENTS

| | | | |
|---|---|---|---|
| 6,316,168 B1 | 11/2001 | Butt et al. | |
| 6,417,561 B1 | 7/2002 | Tuttle | |
| 6,707,083 B1 * | 3/2004 | Hiner et al. | 257/295 |
| 6,737,691 B2 * | 5/2004 | Asao | 257/295 |
| 6,770,491 B2 * | 8/2004 | Tuttle | 438/3 |
| 6,822,278 B1 | 11/2004 | Koutny | |
| 6,958,932 B2 * | 10/2005 | Hosotani et al. | 365/171 |
| 7,344,896 B2 * | 3/2008 | Leuschner et al. | 438/3 |
| 7,456,029 B2 * | 11/2008 | Guo et al. | 438/3 |
| 2004/0076035 A1 * | 4/2004 | Saito et al. | 365/158 |
| 2005/0041462 A1 | 2/2005 | Kent et al. | |
| 2005/0073880 A1 | 4/2005 | Smith et al. | |
| 2006/0019487 A1 * | 1/2006 | Leuschner et al. | 438/637 |

FOREIGN PATENT DOCUMENTS

WO  PCT/US2009/035285   4/2009

* cited by examiner

*Primary Examiner*—Gene N. Auduong
(74) *Attorney, Agent, or Firm*—Ryan, Mason & Lewis, LLP

(57) ABSTRACT

Techniques for shielding magnetic memory cells from magnetic fields are presented. In accordance with aspects of the invention, a magnetic storage element is formed with at least one conductive segment electrically coupled to the magnetic storage element. At least a portion of the conductive segment is surrounded with a magnetic liner. The magnetic liner is operative to divert at least a portion of a magnetic field created by a current passing through the conductive segment away from the magnetic storage element.

19 Claims, 3 Drawing Sheets

MAGNETICALLY DE-COUPLING MAGNETIC MEMORY CELLS AND BIT/WORD LINES FOR REDUCING BIT SELECTION ERRORS

FIELD OF THE INVENTION

The present invention relates generally to electrical and electronic devices, and more particularly to magnetic memory.

BACKGROUND OF THE INVENTION

A potential scaling mechanism for a conventional magnetic random access memory (MRAM) cell is spin-torque switching, wherein injected spin polarized electrons interact with the magnetic moment of a free layer in the MRAM cell and transfer their angular momentum (commonly known as spin momentum transfer, or SMT). If sufficient current is applied, the exerted spin-torque switches the free layer either parallel or antiparallel to a pinned layer in the cell depending on the direction of flow of the current. This type of localized current switching is attractive for memory array applications because it does not have the magnetic half-select problems of conventional MRAM cells. Furthermore, spin-torque switching requires less power to operate and the amount of required current decreases as a device scales to smaller sizes. This is possible due to recent advances in high tunneling magnetoresistance (TMR) devices with magnesium oxide (MgO) barriers, including devices with low resistance-area (RA) product, which have yielded low current spin transfer systems capable of achieving sufficient output voltage for read operations.

Generally, spin-torque switching technology has promising advantages over conventional MRAM; however, conventional patterning and integration techniques have not yet perfected methods that address memory volatility issues inherent in current MRAM. Spin-torque switching requires an external field bias (offset) partly due to problems associated with patterning the magnetic tunnel junction (MTJ) and the deposition of the magnetic stack. An imbalance in the pinned layer and the depth of etch have been identified as major contributors to the required external field bias. Another contributor that has been largely ignored is the undesired stray magnetic field contribution from local wires that supply current. Undesired fields can offset the operation-point of an SMT device, hence requiring an external field bias for switching and normal operation.

SUMMARY OF THE INVENTION

Illustrative embodiments of the present invention beneficially address the above-noted problems with conventional MRAM by providing techniques for diverting magnetic fields created by the electric currents flowing in local wires (e.g., bit lines and word lines) away from a MTJ of a magnetic memory cell. These techniques allow for spin-torque switching via direct current without the need for an external field bias.

In a first aspect of the invention, a memory cell is presented. The memory cell comprises a magnetic storage element. The magnetic storage element is electrically coupled to at least one conductive segment. At least a portion of the at least one conductive segment is surrounded by a magnetic liner. The magnetic liner is operative to divert at least a portion of a magnetic field created by a current passing through the at least one conductive segment away from the magnetic storage element.

The magnetic liner may comprise Ni, Fe, and/or Co. Furthermore, the magnetic liner may surround the at least a portion of the at least one conductive segment closest to the magnetic storage element.

In accordance with another embodiment of the present invention, the at least one conductive segment may comprise a bit line, a word line, and/or a read line. Also, the word line may be a dual damascene word line.

In a second aspect of the invention, a memory circuit is presented. The memory circuit comprises a plurality of memory cells, wherein each of the plurality of memory cells comprises: (i) a magnetic storage element; (ii) at least one conductive segment electrically coupled to the magnetic storage element; and (iii) a magnetic liner surrounding at least a portion of the at least one conductive segment. The magnetic liner is operative to divert at least a portion of a magnetic field created by a current passing through the at least one conductive segment away from the magnetic storage element.

In a third aspect of the invention, a method for shielding a magnetic memory cell from magnetic fields is provided. A magnetic storage element is formed. Further, at least one conductive segment electrically coupled to the magnetic storage element is formed. At least a portion of the at least one conductive segment is surrounded with a magnetic liner. The magnetic liner being operative to divert at least a portion of a magnetic field created by a current passing through the at least one conductive segment away from the magnetic storage element.

In accordance with an additional embodiment of the present invention, the step of surrounding may comprise forming a trench proximate to the magnetic storage element and forming the magnetic liner on at least one surface of the trench. Further, the at least one conductive segment may be formed on at least one surface of the magnetic liner. Still further, a segment of magnetic liner may be formed on top of the at least one conductive segment and at least one portion of the segment of magnetic liner may be etched to create at least one opening in the magnetic liner.

In a fourth aspect of the invention, a method for shielding a plurality of magnetic memory cells from magnetic fields is provided. A plurality of magnetic storage elements are formed. Further, at least one conductive segment electrically coupled to each of the plurality of magnetic storage elements are formed. At least a portion of the at least one conductive segment is surrounded with a magnetic liner. And, the magnetic liner is operative to divert at least a portion of a magnetic field created by a current passing through the at least one conductive segment away from the plurality of magnetic storage elements.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described in conjunction with exemplary methods for shielding a magnetic memory cell from magnetic fields. It should be understood, however, that the invention is not limited to the particular arrangements, materials, film layers and processing steps for forming the memory cell shown and described herein. Modifications to the illustrative embodiments will become apparent to those skilled in the art given the teachings described herein.

Particularly with respect to processing steps, it is emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description. Moreover, details of the process steps used to fabricate such semiconductor devices may be found in a number of publications, for example, S. Wolf and R. N. Tauber, *Silicon Processing for the VLSI Era, Volume 1*, Lattice Press, 1986 and S. M. Sze, *VLSI Technology, Second Edition*, McGraw-Hill, 1988, both of which are incorporated herein by reference.

It should also be understood that the various layers and/or regions shown in the accompanying figures may not be drawn to scale, and that one or more semiconductor layers and/or regions of a type commonly used in such integrated circuits may not be explicitly shown in a given figure for ease of explanation. This does not imply that the semiconductor layers and/or regions not explicitly shown are omitted from the actual integrated circuit.

Figure 1A:
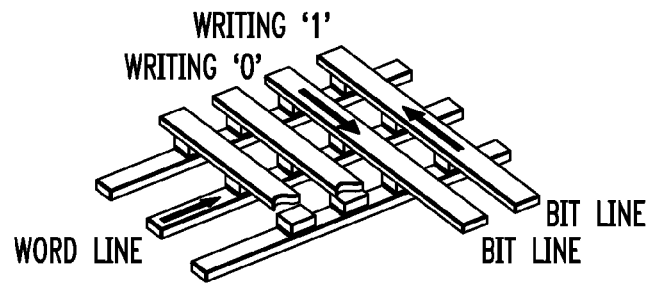
FIGS. 1A-1B are illustrative diagrams depicting the conventional architecture of magnetic random access memory (writing and reading, respectively), in accordance with an embodiment of the present invention.
Figure 1B:
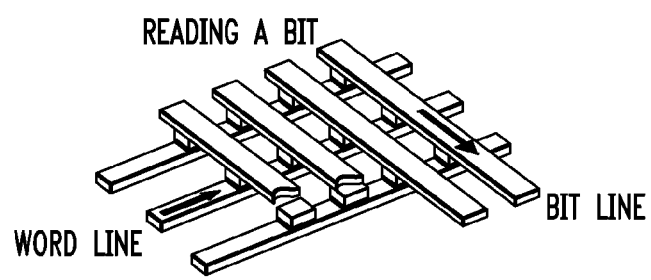

Referring initially to FIGS. 1A-1B, illustrative diagrams depict a conventional architecture for a MRAM array (writing and reading, respectively), in accordance with an embodiment of the present invention. In a typical MRAM array, orthogonal lines (e.g., bitlines and wordlines; conductive segments) pass under and over a formation of memory cells comprising respective MTJs. The lines, when activated, carry current which produces a switching effect in one or more selected memory cells. The MTJs are designed so that their logic state will not change when current is applied to just one line. However, a MTJ at the intersection of two wires carrying current will undergo switching (e.g., writing). FIG. 1A illustrates the writing of two bits (Writing '0' and Writing '1') in two adjacent memory cells. Current is supplied to one word line and two bit lines to produce this effect. The direction of current determines if the free layer of the MTJ will be oriented parallel or anti-parallel to the pinned layer, representing either a logic "0" or a logic "1."

FIG. 1B illustrates an exemplary reading process of an MRAM array. In this example, current is passed through one bit line and one word line to read a memory cell at an intersection thereof. The reading process is accomplished by measuring the resistance of the MTJ in the selected memory cell. The resistance of a MTJ is low when the layers (free and pinned layers) of the MTJ are parallel to one another and high when the layers are anti-parallel to one another. The difference in resistance is used to determine if a MTJ is logic "0" or logic "1." The current needed to measure the resistance of a MTJ (e.g., read) is low in comparison to the current needed for writing, therefore, no switching of the memory cell state should occur during the read process.

Figure 2:
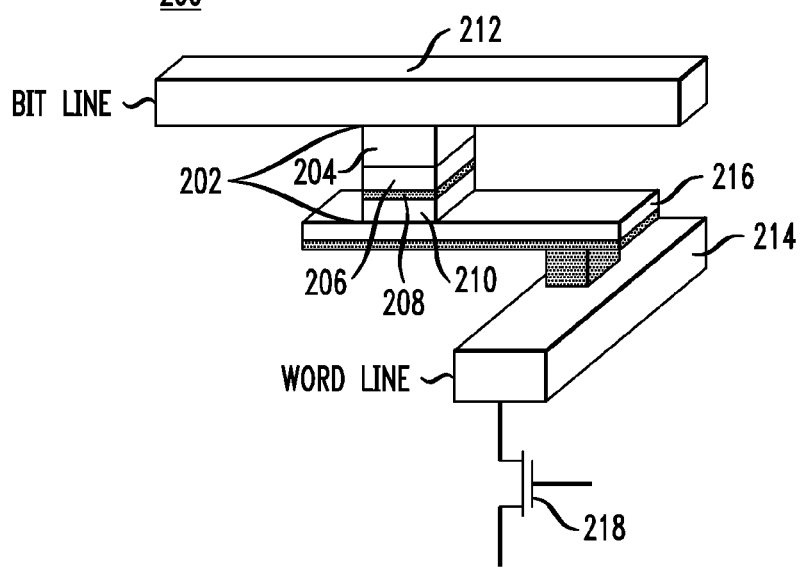
FIG. 2 is a diagram illustrating the features of a magnetic memory cell, in accordance with an embodiment of the present invention.

Referring now to FIG. 2, a diagram illustrates certain features of an exemplary magnetic memory cell 200, in accordance with an embodiment of the present invention. The magnetic memory cell 200 may comprise a MTJ 202, or an alternative magnetic storage element (e.g., a SMT device or spintronic device), a bit line 212, a word line 214, a bottom electrode 216, and a metal-oxide-semiconductor field-effect transistor (MOSFET) 218 which may be used for selectively accessing the memory cell.

For illustrative purposes, the MTJ 202 is shown to include, from top to bottom, an electrode 204, a magnetic free layer 206, a barrier layer (e.g., tunneling layer) 208, and a magnetic pinned layer 210. Each magnetic layer of MTJ 202 may further comprise a number of sublayers. These sublayers may be formed from many different materials and may serve various functions such as, but not limited to, acting as barrier layers, seed layers, antiferromagnetic layers, coupling layers and ferromagnetic layers. Desikan et al., for example, describes a MTJ with a lower magnetic layer comprising five sublayers formed of cobalt/iron, nickel/iron, manganese/iron, platinum and tungsten, respectively. Desikan et al., *On-chip MRAM as a High-Bandwidth Low Latency Replacement for DRAM Physical Memories*, Tech Report TR-02-47, Dept. of Computer Sciences, University of Texas, September 2002. The upper magnetic layer in the same device comprises three sublayers formed of nickel/iron, cobalt/iron and platinum, respectively. Id. The dielectric barrier is aluminum oxide. Id. The layers of MTJ 202 are shown as single layers for simplicity of illustration even though they may typically comprise a plurality of sublayers.

One skilled in the art will recognize the layers and functionality of MTJ 202. Briefly, one of the magnetic layers, which is referred to as the pinned layer 210, has a magnetic polarization that is pinned in a fixed direction while the polarization of the other magnetic layer, which is referred to as the free layer 206, has a magnetic polarization that is aligned either parallel or antiparallel to the pinned layer. In spin-torque switching, the orientation of the free layer is switched using direct current, and not by the use of magnetic fields as in conventional techniques. Depending on the flow of the current through the MTJ device, the free layer is aligned parallel or antiparallel to the pinned layer.

Resistance of the MTJ is measured via a bottom electrode 216 and a MOSFET 218 connected to the bottom electrode. The current required for reading and writing is supplied through bit line 212 and word line 214. An inherent property of current traveling through a wire is the generation of a magnetic field surrounding the wire. Magnetic fields generated by current running through the bit line and word line may unintentionally switch cells adjacent to or connected to the current filled lines. An unintentional switch in the state of a memory cell caused by a wire directly above or below a MTJ is called a "self error." An unintentional switch caused by a wire of an adjacent MTJ is called a "half-select error." Inevitably, switch errors result in corrupt or lost data and are thus undesirable.

Figure 3A:
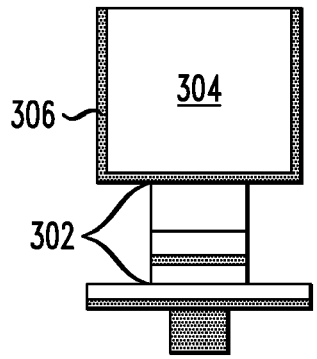
FIGS. 3A-3C depict cross-sections of three exemplary embodiments of a memory cell and corresponding bit line connected to the memory cell, in accordance with embodiments of the present invention.
Figure 3B:
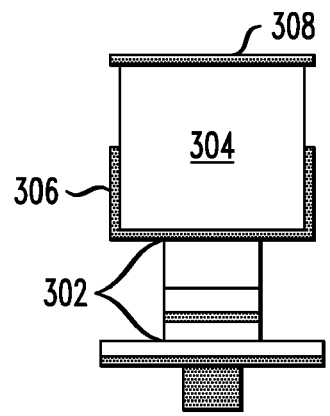
Figure 3C:
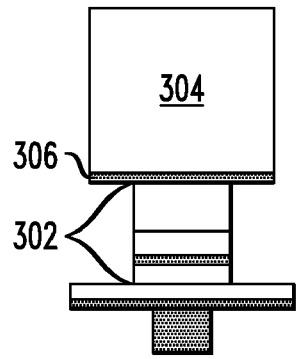

Since spin-torque switching does not require magnetic fields for normal operation, the magnetic fields created by wires carrying current may be suppressed and/or diverted away from a MTJ. FIGS. 3A-3C depict cross-sectional views of illustrative arrangements of an exemplary memory cell including a MTJ storage element 302 and a corresponding bit line 304 connected to the MTJ element, in accordance with embodiments of the present invention. As apparent from the figures, the bit line 304 is at least partially surrounded by a magnetic liner 306. More specifically, FIG. 3A illustrates a U-shaped magnetic liner 306 partially surrounding bit line 304. In this embodiment, an upper surface of bit line 304 does not include magnetic liner material. In an illustrative embodiment, the magnetic liner comprises nickel (Ni), iron (Fe), and/or cobalt (Co), although alternative materials and/or combinations of materials may be employed. Further, the magnetic liner 306 is conductive as to allow current to flow from the bit line 304 through the MTJ element 302 for writing a logical state of the memory cell.

As a current is passed through the bit line 304, the current generates a magnetic field acting on the MTJ 302. The current also changes the magnetization of the magnetic liner 306, generating an additional stray field on the MTJ 302. In an illustrative embodiment, the magnetic material in the magnetic liner 306 is positioned in such a way that the stray field generated by the magnetic liner 306 reduces or eliminates the magnetic field acting on the MTJ 302. An additional benefit of the magnetic liner is the suppression of copper (Cu) electromigration between the bit line supplying current and any neighboring material. Furthermore, the magnetic liner may act as a barrier against stray magnetic fields created by other electromagnetic sources in addition to the wire it surrounds.

FIG. 3B is a cross-sectional view depicting an alternative configuration of a magnetic liner (306 and 308), in accordance with another embodiment of the invention. Specifically, bit line 304 is at least partially surrounded by a magnetic liner comprising a truncated, U-shaped magnetic liner portion 306 and a top segment magnetic liner portion 308. The U-shaped magnetic liner 306 is truncated in the sense that it does not cover the entire sidewalls of bit line 304. This arrangement essentially creates two side openings in the magnetic liner which operate to divert magnetic fields away from the MTJ 302 in two opposite directions. In other embodiments of the invention, the top segment 308 may be optionally omitted. In effect, this arrangement of the magnetic liner produces a cancellation, at the MTJ 302, of the current-induced magnetic field and the dipole field of the liner.

FIG. 3C is a cross-sectional view depicting yet another configuration of the magnetic liner 306, in accordance with another embodiment of the invention. As shown in FIG. 3C, magnetic liner 306 is formed as a substantially flat plate on an upper surface of MTJ 302, rather than as a U-shaped structure as depicted in FIGS. 3A and 3B. This arrangement diverts the magnetic field generated by current flowing through bit line 304 out and away from the MTJ 302. The processing required to fabricate this arrangement may be simpler compared to other configurations of the magnetic liner because it only requires one flat layer of liner material. Accordingly, this embodiment may provide certain cost benefits, depending upon the application in which the memory cell is to be used. It should be noted that the width of the magnetic liner 306 of FIG. 3C may extend beyond the width of the bit line 304 or the width of the magnetic liner 306 may be shorter than the width of the bit line 304.

It is to be appreciated that the magnetic liner is not limited to a U-shape or to a liner with two side openings as illustrated in FIGS. 3A and 3B, respectively, or to a substantially flat plate structure as illustrated in FIG. 3C. Rather, the invention contemplates that the magnetic liner may vary in shape, size, thickness, and/or composition depending on how and where it is to be used. By changing the material, shape, and thickness of the magnetic liner, the magnetic field affecting an MTJ can be adjusted. Furthermore, the magnetic liner need not be in direct contact with the wire it surrounds. In an alternative embodiment, an additional layer of conductive material may be situated between a current carrying wire and its surrounding magnetic liner. Those skilled in the art, given the teachings herein, will be able to contemplate various other arrangements for the magnetic liner that are within the scope of the present invention.

Figure 4:
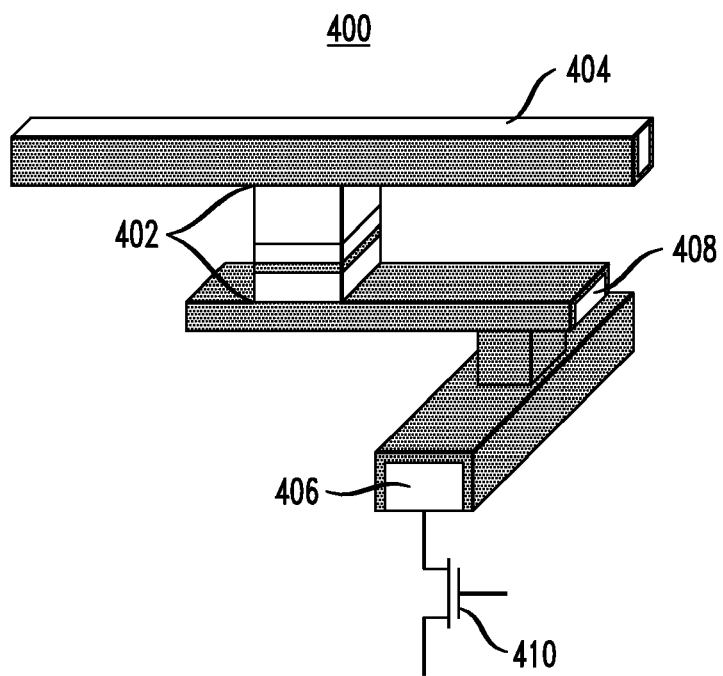
FIG. 4 is a diagram illustrating a memory cell in which all local wires proximate to the memory cell are surrounded by magnetic liners, in accordance with an embodiment of the present invention.

Further, although FIGS. 3A through 3C illustrate the magnetic lining of a single bit line, it should be noted that multiple magnetic liners may be used on any and all field producing wires neighboring a given memory cell. For instance, FIG. 4 illustrates at least a portion of an exemplary memory circuit 400 including a memory cell 402, a MOSFET 410, a bit line 404, and a word line 406 for selectively accessing the memory cell. In this embodiment, all local wires (e.g., bit line 404, word line 406, and a bottom electrode 408 of a MTJ included in memory cell 402) proximate to the memory cell are at least partially surrounded by respective magnetic liners, in accordance with another aspect of the invention. Memory circuit 400 has U-shaped liners at least partially surrounding the bit line 404, the word line 406, and the bottom electrode 408. In an illustrative embodiment, a magnetic liner may also be used on a dual damascene word line. It should be noted that each U-shaped liner is arranged in a way that it directs a magnetic field created by current flowing in the particular conductor conveying the current away from the memory cell 402. For example, the opening of the U-shaped magnetic liner associated with the word line 406 preferably has an opening facing away from the memory cell 402 (e.g., downward, opposite the memory cell). The magnetic liner associated with the bottom electrode 408 may be configured in a similar manner.

In an addition to the embodiments of the present invention described herein, it should be appreciated that the inventive techniques of shielding magnetic fields may be advantageously used on other types of circuitry and not limited to semiconductor memory devices. For example, spintronic logic devices and other spintronic circuitry, which utilize the quantum spin of electrons as well as their charge to carry information, may similarly benefit from such magnetic shielding.

Referring now to FIGS. 5A-5F, cross-sections of a memory cell illustrate various stages of processing using an exemplary methodology for shielding the memory cell from magnetic fields, in accordance with an embodiment of the present invention. It is to be appreciated that the following process has been simplified for ease of explanation. However, one skilled in the art will readily recognize those processing steps omitted from this generalized description. In carrying out the following process, techniques for depositing metal layers include, but are not limited to, sputter deposition, evaporation, chemical vapor deposition (CVD) and electroplating. Background on these techniques and others is provided in, for example, R. F. Bunshah, *Handbook of Deposition Technologies for Films and Coatings, Second Edition*, Noyes Publishing, 1994, which is incorporated herein by reference.

Figure 5A:
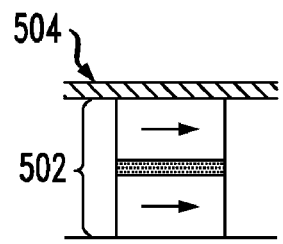
FIGS. 5A-5F show cross-sections of a memory cell during various stages of processing using an exemplary methodology for shielding a memory cell from magnetic fields, in accordance with an embodiment of the present invention.
Figure 5B:
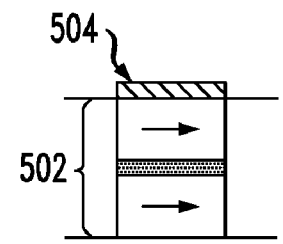

FIG. 5A illustrates a cross-sectional view of an exemplary MTJ 502 comprising a magnetic free layer, a thin dielectric layer, and a magnetic pinned layer forming a stacked structure. A layer of conductive material 504 is first deposited on top of the MTJ stack. The layer of conductive material is then patterned, using a conventional photolithographic process, and etched using a wet or dry etching technique. FIG. 5B shows the etched layer of conductive material 504 on top of the MTJ 502. This layer will preferably form a bottom wall of the magnetic liner. Alternatively, layer 504 may form a barrier layer to prevent out-diffusion of the material in the free layer into adjacent regions.

Figure 5C:
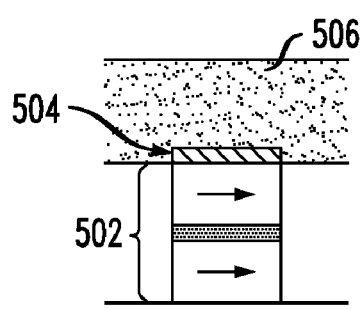
Figure 5D:
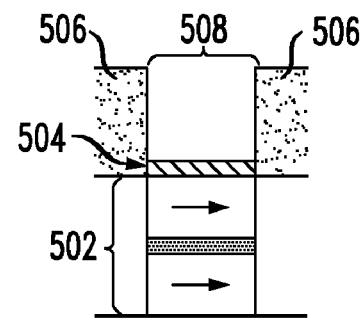

In FIG. 5C, a dielectric layer 506, or alternative insulating material (e.g., silicon dioxide or silicon nitride), is deposited on an upper surface of the MTJ 502. In FIG. 5D, a trench 508 is etched through the dielectric layer 506 to the top surface of conductive layer 504. Trench 508 is substantially aligned with the MTJ 502 so that conductive layer 504 forms at least a portion of the bottom wall of the trench. In alternative embodiments, conductive layer 504 need not form a bottom wall of trench 508, and the trench may be etched to at least a portion of the MTJ 502. Regardless of how trench 508 is formed, at least a portion of the trench facilitates electrical contact to the MTJ 502. Trench 508 preferably forms a foundation for wiring material (e.g., bit line, word line) for providing electrical access to the MTJ 502.

Figure 5E:
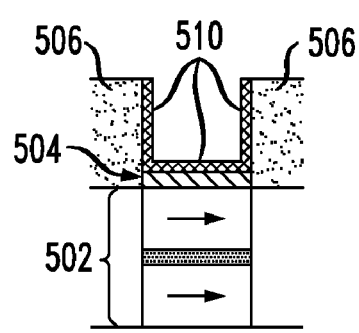
Figure 5F:
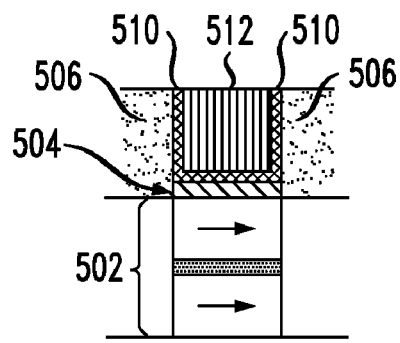

As shown in FIG. 5E, magnetic liner material 510 is preferably formed on at least a portion of interior surfaces of the trench 508 (e.g., sidewalls and bottom wall). In FIG. 5F, a conductive material 512, such as, for example, copper, is deposited into the trench 508 on top of the magnetic liner material 510, filling the trench so as to be substantially planar with an upper surface of the dielectric layer 506. Chemical-mechanical polishing (CMP), or an alternative technique, may be used to planarize the upper surface of the memory cell.

The techniques for shielding a magnetic memory cell from magnetic fields described herein may be implemented in the form of an integrated circuit. In forming integrated circuits, a plurality of identical die is typically fabricated in a repeated pattern on a surface of a semiconductor wafer. Each die includes a device formed by the methods described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A memory cell, the memory cell comprising:
   a magnetic storage element;
   at least one conductive segment electrically coupled to the magnetic storage element; and
   a magnetic liner surrounding at least a portion of the at least one conductive segment, the magnetic liner being operative to divert at least a portion of a magnetic field created by a current passing through the at least one conductive segment away from the magnetic storage element;
   wherein the magnetic liner is situated between the at least one conductive segment and the magnetic storage element.

2. The memory cell of claim 1, wherein the at least one conductive segment comprises at least one of a bit line, a word line, and a read line.

3. The memory cell of claim 2, wherein the word line is a dual damascene word line.

4. The memory cell of claim 1, wherein the magnetic liner comprises at least one of nickel, iron and cobalt.

5. The memory cell of claim 1, wherein the magnetic storage element comprises a spin momentum transfer device.

6. A memory circuit, the memory circuit comprising:
   a plurality of memory cells,
   wherein each of the plurality of memory cells comprises:
      (i) a magnetic storage element; (ii) at least one conductive segment electrically coupled to the magnetic storage element; and (iii) a magnetic liner surrounding at least a portion of the at least one conductive segment, the magnetic liner being operative to divert at least a portion of a magnetic field created by a current passing through the at least one conductive segment away from the magnetic storage element;
   wherein the magnetic liner is situated between the at least one conductive segment and the magnetic storage element.

7. The memory circuit of claim 6, wherein the at least one conductive segment comprises at least one of a bit line, a word line, and a read line.

8. The memory circuit of claim 6, wherein the magnetic liner comprises at least one of nickel, iron and cobalt.

9. A method for shielding a magnetic memory cell from magnetic fields, the method comprising the steps of:
   forming a magnetic storage element;
   forming at least one conductive segment electrically coupled to the magnetic storage element; and
   surrounding at least a portion of the at least one conductive segment with a magnetic liner, the magnetic liner being operative to divert at least a portion of a magnetic field created by a current passing through the at least one conductive segment away from the magnetic storage element;
   wherein the magnetic liner is formed between the at least one conductive segment and the magnetic storage element.

10. The method of claim 9, wherein the step of surrounding further comprises the steps of:
    forming a trench proximate to the magnetic storage element; and
    forming the magnetic liner on at least one surface of the trench.

11. The method of claim 10, wherein the magnetic liner is formed on at least a portion of the at least one surface of the trench.

12. The method of claim 11, wherein the at least one conductive segment is formed on at least one surface of the magnetic liner.

13. The method of claim 12, further comprising the steps of:
    forming a segment of magnetic liner on top of the at least one conductive segment; and
    etching at least one portion of the segment of magnetic liner to create at least one opening in the magnetic liner.

14. The method of claim 9, wherein the magnetic liner comprises at least one of nickel, iron, and cobalt.

15. A method for shielding a plurality of magnetic memory cells from respective magnetic fields, the method comprising the steps of:
    forming a plurality of magnetic storage elements;
    forming at least one conductive segment electrically coupled to a corresponding one of the plurality of magnetic storage elements; and
    surrounding at least a portion of the at least one conductive segment with a magnetic liner, the magnetic liner being operative to divert at least a portion of a magnetic field created by a current passing through the at least one conductive segment away from the corresponding one of the plurality of magnetic storage elements;

wherein the magnetic liner is formed between the at least one conductive segment and the magnetic storage element.

16. The method of claim 15, wherein the step of surrounding at least a portion of the at least one conductive segment with a magnetic liner further comprises:

forming a trench proximate to at least one of the plurality of magnetic storage elements; and forming the magnetic liner on at least one surface of the trench.

17. The method of claim 16, wherein the magnetic liner is formed on at least one portion of the at least one surface of the trench.

18. The method of claim 17, wherein the at least one conductive segment is formed on at least one surface of the magnetic liner.

19. The method of claim 18, further comprising the steps of:

forming a segment of magnetic liner on an upper surface of the at least one conductive segment; and etching at least a portion of the segment of magnetic liner to create at least one opening in the magnetic liner.

* * * * *